United States Patent
Weiser et al.

(10) Patent No.: US 9,666,547 B2
(45) Date of Patent: May 30, 2017

(54) METHOD OF REFINING SOLDER MATERIALS

(75) Inventors: Martin W. Weiser, Liberty Lake, WA (US); Nancy F. Dean, Liberty Lake, WA (US); Brett M. Clark, Spokane, WA (US); Michael J. Bossio, Spokane, WA (US); Ronald H. Fleming, Spokane, WA (US); James P. Flint, Spokane, WA (US)

(73) Assignee: Honeywell International Inc., Morris Plains, NJ (US)

( * ) Notice: Subject to any disclaimer, the term of this patent is extended or adjusted under 35 U.S.C. 154(b) by 577 days.

(21) Appl. No.: 12/769,130

(22) Filed: Apr. 28, 2010

(65) Prior Publication Data

US 2010/0206133 A1    Aug. 19, 2010

Related U.S. Application Data

(60) Continuation of application No. 11/592,396, filed on Nov. 2, 2006, now abandoned, which is a division of
(Continued)

(51) Int. Cl.
*H01L 21/44* (2006.01)
*H01L 23/00* (2006.01)
(Continued)

(52) U.S. Cl.
CPC ............ *H01L 24/10* (2013.01); *B23K 35/025* (2013.01); *C25C 1/18* (2013.01);
(Continued)

(58) Field of Classification Search
CPC ................. H01L 24/10; H01L 24/13; H01L 2924/01084; H01L 2924/014; H01L 2924/01047
(Continued)

(56) References Cited

U.S. PATENT DOCUMENTS 4,158,769 A    6/1979  Smith
4,501,666 A    2/1985  Ogata et al.
(Continued)

FOREIGN PATENT DOCUMENTS

EP    770708 B1    1/2000
JP    58-151037 A2    9/1983
(Continued)

OTHER PUBLICATIONS

International Search Report issued in PCT/US03/30783, mailed Apr. 29, 2004.
(Continued)

*Primary Examiner* — Hoa B Trinh
(74) *Attorney, Agent, or Firm* — Faegre Baker Daniels LLP

(57) ABSTRACT

The invention includes solder materials having low concentrations of alpha particle emitters, and includes methods of purification of materials to reduce a concentration of alpha particle emitters within the materials. The invention includes methods of reducing alpha particle flux in various lead-containing and lead-free materials through purification of the materials. The invention also includes methods of estimating the fractionation of a low concentration of one or more alpha particle emitters during purification of a material.

20 Claims, 3 Drawing Sheets

Related U.S. Application Data application No. 10/670,319, filed on Sep. 26, 2003, now abandoned.

(60) Provisional application No. 60/417,241, filed on Oct. 8, 2002.

(51) Int. Cl.
| | |
|---|---|
| *B23K 35/02* | (2006.01) |
| *C25C 1/18* | (2006.01) |
| *H01L 23/498* | (2006.01) |
| *B23K 35/26* | (2006.01) |
| *C22B 13/06* | (2006.01) |
| *H01L 23/31* | (2006.01) |
| *H05K 3/34* | (2006.01) |

(52) U.S. Cl.
CPC ........ *H01L 23/49816* (2013.01); *H01L 24/13* (2013.01); *B23K 35/26* (2013.01); *B23K 35/268* (2013.01); *C22B 13/06* (2013.01); *H01L 23/3128* (2013.01); *H01L 2224/05568* (2013.01); *H01L 2224/05573* (2013.01); *H01L 2224/13* (2013.01); *H01L 2224/13099* (2013.01); *H01L 2224/16225* (2013.01); *H01L 2924/00014* (2013.01); *H01L 2924/014* (2013.01); *H01L 2924/01005* (2013.01); *H01L 2924/01006* (2013.01); *H01L 2924/01012* (2013.01); *H01L 2924/01015* (2013.01); *H01L 2924/01029* (2013.01); *H01L 2924/01033* (2013.01); *H01L 2924/01047* (2013.01); *H01L 2924/01049* (2013.01); *H01L 2924/01079* (2013.01); *H01L 2924/01082* (2013.01); *H01L 2924/01084* (2013.01); *H01L 2924/01088* (2013.01); *H01L 2924/01092* (2013.01); *H01L 2924/12042* (2013.01); *H01L 2924/14* (2013.01); *H05K 3/3463* (2013.01); *H05K 3/3484* (2013.01)

(58) Field of Classification Search
USPC ............... 438/108, 613, 650, 686, 612, 666; 257/E23.021, E23.069, E21.508
See application file for complete search history.

(56) References Cited

U.S. PATENT DOCUMENTS

| | | | |
|---|---|---|---|
| 4,512,950 A | 4/1985 | Nosoda et al. | |
| 4,584,161 A | 4/1986 | Post et al. | |
| 4,770,698 A | 9/1988 | Dunlop et al. | |
| 4,816,299 A | 3/1989 | Alpha et al. | |
| 4,887,492 A | 12/1989 | Dunlop et al. | |
| 4,915,802 A | 4/1990 | Dunlop et al. | |
| 5,021,130 A | 6/1991 | Metzger et al. | |
| 5,082,538 A | 1/1992 | DeRespiris et al. | |
| 5,094,726 A | 3/1992 | Nobel et al. | |
| 5,110,423 A | 5/1992 | Little et al. | |
| 5,174,887 A | 12/1992 | Federman et al. | |
| 5,183,541 A | 2/1993 | Snyder et al. | |
| 5,185,076 A | 2/1993 | Yanada et al. | |
| 5,188,713 A | 2/1993 | O'Brien et al. | |
| 5,215,631 A | 6/1993 | Westfall | |
| 5,217,585 A | 6/1993 | Snyder et al. | |
| 5,221,038 A | 6/1993 | Melton et al. | |
| 5,223,118 A | 6/1993 | Sonnenberg et al. | |
| 5,282,953 A | 2/1994 | Gernon et al. | |
| 5,300,368 A | 4/1994 | Kubert et al. | |
| 5,320,737 A | 6/1994 | Chao et al. | |
| 5,376,239 A | 12/1994 | Saito et al. | |
| 5,378,347 A | 1/1995 | Thomson et al. | |
| 5,464,507 A | 11/1995 | de Nora et al. | |
| 5,471,096 A | 11/1995 | Papathomas et al. | |
| 5,507,842 A | 4/1996 | Fiorino | |
| 5,520,794 A * | 5/1996 | Gernon | C25C 1/18 205/598 |
| 5,545,306 A | 8/1996 | Shimamune et al. | |
| 5,618,404 A * | 4/1997 | Okuhama et al. | 205/445 |
| 5,651,873 A | 7/1997 | Uchiyama et al. | |
| 5,674,374 A | 10/1997 | Sakurai et al. | |
| 5,897,336 A | 4/1999 | Brouillette | |
| 5,965,945 A * | 10/1999 | Miller et al. | 257/781 |
| 5,990,564 A | 11/1999 | Degani et al. | |
| 5,997,711 A | 12/1999 | Bourke | |
| 6,015,482 A | 1/2000 | Stern | |
| 6,103,088 A | 8/2000 | Guhl et al. | |
| 6,176,996 B1 | 1/2001 | Moon | |
| 6,183,545 B1 | 2/2001 | Okuhama et al. | |
| 6,187,114 B1 | 2/2001 | Ogashiwa et al. | |
| 6,221,691 B1 | 4/2001 | Schrock | |
| 6,224,690 B1 | 5/2001 | Andricacos et al. | |
| 6,248,228 B1 | 6/2001 | Gillman | |
| 6,258,241 B1 | 7/2001 | Takahashi | |
| 6,258,294 B1 | 7/2001 | Johnson, II et al. | |
| 6,342,114 B1 | 1/2002 | Lam et al. | |
| 6,346,469 B1 | 2/2002 | Greer | |
| 6,391,476 B2 | 5/2002 | Wittebrood et al. | |
| 6,433,390 B1 | 8/2002 | Hara | |
| 6,548,392 B2 | 4/2003 | Akram et al. | |
| 6,552,843 B1 | 4/2003 | Tench et al. | |
| 6,674,072 B2 | 1/2004 | Lykken et al. | |
| 6,677,056 B2 | 1/2004 | Tanaka et al. | |
| 6,730,209 B2 * | 5/2004 | Abys et al. | 205/253 |
| 6,749,739 B2 | 6/2004 | Chalyt et al. | |
| 6,777,814 B2 | 8/2004 | Iwasaki et al. | |
| 6,808,614 B2 | 10/2004 | Khaselev et al. | |
| 6,849,139 B2 * | 2/2005 | Kardokus et al. | 148/522 |
| 6,923,899 B2 | 8/2005 | Brown et al. | |
| 7,151,049 B2 | 12/2006 | Beica et al. | |
| 7,160,629 B2 | 1/2007 | Crosby | |
| 7,521,286 B2 | 4/2009 | Weiser et al. | |
| 8,026,613 B2 | 9/2011 | Fogel et al. | |
| 2002/0166774 A1 * | 11/2002 | Schetty et al. | 205/252 |
| 2003/0066756 A1 | 4/2003 | Gabe et al. | |
| 2003/0094571 A1 | 5/2003 | Lykken et al. | |
| 2003/0178707 A1 * | 9/2003 | Abbott | 257/666 |
| 2004/0065954 A1 | 4/2004 | Weiser et al. | |
| 2004/0231978 A1 | 11/2004 | White | |
| 2006/0090819 A1 | 5/2006 | Egli | |
| 2006/0113195 A1 | 6/2006 | Hradil et al. | |
| 2007/0012576 A1 | 1/2007 | Binstead et al. | |
| 2008/0050611 A1 | 2/2008 | Kwok et al. | |
| 2009/0039515 A1 | 2/2009 | Farooq et al. | |
| 2009/0098012 A1 | 4/2009 | Shindo et al. | |
| 2010/0140760 A1 | 6/2010 | Tam et al. | |
| 2010/0206133 A1 | 8/2010 | Weiser et al. | |
| 2011/0292572 A1 | 12/2011 | Chacko et al. | |
| 2012/0298586 A1 | 11/2012 | Grandbois | |

FOREIGN PATENT DOCUMENTS

| | | |
|---|---|---|
| JP | 59-064790 A | 4/1984 |
| JP | 59064791 A | 4/1984 |
| JP | 62001478 B | 1/1987 |
| JP | 62-146289 A2 | 6/1987 |
| JP | 62-146289 U1 | 9/1987 |
| JP | 1283398 A | 11/1989 |
| JP | 1283398 A2 | 11/1989 |
| JP | 02-228487 A | 9/1990 |
| JP | 4028893 A | 1/1992 |
| JP | 4052298 A | 2/1992 |
| JP | 4072071 A | 3/1992 |
| JP | 4072090 A | 3/1992 |
| JP | 4154983 A | 5/1992 |
| JP | 4206344 A | 7/1992 |
| JP | 4215463 A | 8/1992 |
| JP | 4333590 A | 11/1992 |
| JP | 4352429 A | 12/1992 |
| JP | 5025690 A | 2/1993 |
| JP | 5077087 A | 3/1993 |
| JP | 5195283 A | 8/1993 |
| JP | 5198245 A | 8/1993 |

(56) References Cited

FOREIGN PATENT DOCUMENTS

| | | |
|---|---|---|
| JP | 5295592 A | 11/1993 |
| JP | 5311280 A | 11/1993 |
| JP | 6182580 A | 7/1994 |
| JP | 6063110 B2 | 8/1994 |
| JP | 6235088 A | 8/1994 |
| JP | 7023558 B2 | 3/1995 |
| JP | 7030478 B2 | 4/1995 |
| JP | 7065206 B2 | 7/1995 |
| JP | 7065207 B2 | 7/1995 |
| JP | 7084671 B2 | 9/1995 |
| JP | 07-280998 A | 10/1995 |
| JP | 7268511 A | 10/1995 |
| JP | 7300696 A | 11/1995 |
| JP | 8035088 A2 | 2/1996 |
| JP | 8246200 A2 | 9/1996 |
| JP | 8260185 A | 10/1996 |
| JP | 8260186 A | 10/1996 |
| JP | 02559935 B2 | 12/1996 |
| JP | 8325783 A | 12/1996 |
| JP | 09015121 A | 1/1997 |
| JP | 2590869 B2 | 3/1997 |
| JP | 9260427 A | 10/1997 |
| JP | 02709510 B2 | 2/1998 |
| JP | 10050501 A | 2/1998 |
| JP | 10-58190 | 3/1998 |
| JP | 10-102276 A | 4/1998 |
| JP | 10093004 A | 4/1998 |
| JP | 2754030 B2 | 5/1998 |
| JP | 2754030 B2 | 5/1998 |
| JP | 1116940 A | 1/1999 |
| JP | 11080852 A | 3/1999 |
| JP | 11080852 A | 3/1999 |
| JP | 11217634 A | 8/1999 |
| JP | 11251503 A | 9/1999 |
| JP | 02983548 B2 | 11/1999 |
| JP | 11343590 A | 12/1999 |
| JP | 2000232008 A | 8/2000 |
| JP | 03096465 B2 | 10/2000 |
| JP | 2000275429 A | 10/2000 |
| JP | 2000349111 A | 12/2000 |
| JP | 2001-082538 A | 3/2001 |
| JP | 2001196409 A | 7/2001 |
| JP | 2001279344 A | 10/2001 |
| JP | 2002-120089 | 4/2002 |
| JP | 03292055 B2 | 6/2002 |
| JP | 2002266097 A | 9/2002 |
| JP | 03334594 B2 | 10/2002 |
| JP | 2003027277 A | 1/2003 |
| JP | 2003089898 A | 3/2003 |
| JP | 03419951 B2 | 6/2003 |
| JP | 03429894 B2 | 7/2003 |
| JP | 2003193283 A | 7/2003 |
| JP | 2004-244711 A2 | 9/2004 |
| JP | 2005048205 A | 2/2005 |
| JP | 2005-290505 A2 | 10/2005 |
| JP | 2005340275 A | 12/2005 |
| JP | 03776566 B2 | 5/2006 |
| JP | 2006124788 A | 5/2006 |
| JP | 03871018 B2 | 1/2007 |
| JP | 03882608 B2 | 2/2007 |
| JP | 03904333 B2 | 4/2007 |
| JP | 2007302496 A | 11/2007 |
| JP | 2008019468 A | 1/2008 |
| JP | 04219224 B2 | 2/2009 |
| JP | 2009074128 A | 4/2009 |
| JP | 2009074129 A | 4/2009 |
| JP | 04362568 B2 | 11/2009 |
| JP | 04389083 B2 | 12/2009 |
| JP | 4397530 B2 | 1/2010 |
| JP | 2010-156052 A | 7/2010 |
| JP | 2010-156052 A2 | 7/2010 |
| JP | 04582294 B2 | 11/2010 |
| JP | 04605359 B2 | 1/2011 |
| JP | 04632027 B2 | 2/2011 |
| JP | 04758614 B2 | 8/2011 |
| JP | 2011-214040 A | 10/2011 |
| JP | 2011-214061 A | 10/2011 |
| JP | 2012087407 A | 5/2012 |
| JP | 4975367 B2 | 7/2012 |
| JP | 2012131018 A | 7/2012 |
| JP | 2012201932 A | 10/2012 |
| TW | 259737 | 10/1995 |
| TW | 259819 | 10/1995 |
| TW | 327654 B | 3/1998 |
| TW | 349267 | 1/1999 |
| TW | 409379 | 10/2000 |
| TW | 460623 | 10/2001 |
| TW | 473956 | 1/2002 |
| WO | WO0043576 A1 | 7/2000 |
| WO | WO2011114824 A1 | 9/2011 |

OTHER PUBLICATIONS

International Search Report completed Apr. 30, 2010 in ROC (Taiwan) Application No. 092127949, 2 pages.
Mackey, Thomas E., "The Electrolytic Tin Refining Plant at Texas City, Texas", Journal of Metals, Jun. 1969, pp. 32-43.
Rodriguez, J.F., "Production of high-grade tin in a new electrolytic plant", presented at the international symposium entitled Hydrometallurgy '94, organized by the Institution of Mining and Metallurgy and the Society of Chemical Industry, Institution of Mining and Metallurgy, Cambridge England, Jul. 11-15, 1994, pp. 939-946.
Clark, Dr. Brett, "A Study of Alpha Emitting Isotope Migration Withn Lead-Free Materials", presented at the IEEE SER Workshop, Oct. 28, 2010.
Zastawny, A., et al., Migration of 210Po in Lead to the Surface, Appl. Radiol. Isot., vol. 43, No. 9, pp. 1147-1150, 1992.
Alpha radiation sources in low alpha materials and implications for low alpha materials refinement,: Clark et al., Thin Solid Films vol. 462-463, Issue SPEC. ISS., Sep. 2004, pp. 384-386.
"Development of low alpha particle's solder for forming bumps," Takahashi et al., Symposium on "Microjoining and Assembly Technology in Electronics", vol. 6, pp. 33-38, Journal 2000.
"Alpha Emission Measurements of Lids and Solder Preforms on Semiconductor Packages," S. Levine, Components, Hybrids, and Manufacturing Technology, IEEE Transactions, vol. 2, Issue 4, pp. 391-395, Dec. 1979.
"Ultra low alpha emission lead free solder for flip chip bumps," Moriwaka et al., Proceedings of SPIE—The International Society for Optical Engineering 2001, International Symposium on Microelectronics, Baltimore, MD, Oct. 9, 2001-Oct. 11, 2001, vol. 4587, pp. 559-564.
"Peculiarities of measuring the alpha particle activity of flat samples of metals, alloys and powders using gas flow proportional counters specifically the model 1950 manufactured by "spectrum sciences", USA," Zakharyasah et al., Proceedings of the IEEE/CPMT Internatioanl Electronics Manufacturing Technology Symposium, vol. 29, 2004, pp. 152-157.
"Ultrapure materials for alpha particle-sensitive applications," Dunlop et al., Journal of Metals, vol. 41, Issue 6, Jun. 1989, pp. 18-21.
"Characteristics of low α Sn—Ag plating for Pb free bumping," Masuda et al., 10th Symposium on Microjoining and Assembly Technology in Electronics, Feb. 5-6, 2004, Yokohama.
"Formation of dummy solder patterns as an alpha particle barrier for integrated circuits," IP.com Journal 2005.
"Wafer bumping. Low-alpha lead considerations," Nair et al., Advanced Packaging Feb. 2002, pp. 41-43.
"Soft error rates in solder bumped packaging," M. Roberson, Proceedings International Symposium on Advanced Packaging Materials: Processes, Properties and Interfaces, 4th Braselton, GA., Mar. 15-18, 1998, pp. 111-116.

* cited by examiner

METHOD OF REFINING SOLDER MATERIALS

CROSS-REFERENCE TO RELATED APPLICATIONS

This application is a continuation of U.S. patent application Ser. No. 11/592,396, which was filed on Nov. 2, 2006, which is a divisional of U.S. patent application Ser. No. 10/670,319, which was filed Sep. 26, 2003, and which claims the benefit under 35 U.S.C, §119 of U.S. Provisional Application 60/417,241, which was filed on Oct. 8, 2002. Each of these applications is hereby incorporated by reference.

FIELD OF THE INVENTION

The invention pertains to semiconductor packages, lead-containing solders and anodes, and methods of removing alpha-emitters from materials.

BACKGROUND OF THE INVENTION

Solders are commonly utilized in semiconductor device packaging. If the solders contain alpha particle emitting isotopes (referred to herein as alpha particle emitters), emitted alpha particles can cause damage to packaged semiconductor devices. Accordingly, it is desired to reduce the concentration of alpha particle emitters within the solders.

An exemplary prior art semiconductor package is shown in FIG. 1 as a package 50, with the exemplary package representing a flip-chip construction. The package comprises a semiconductor component 12 (such as, for example, an integrated circuit chip). The package also comprises a board 14 utilized to support the semiconductor component 12. A plurality of contact pads 38 (only some of which are labeled) are joined to chip 12, and a plurality of contact pads 40 (only some of which are labeled) are joined to board 14. Solder balls or bumps 39 (only some of which are labeled) are provided between pads 38 and 40 to form electrical interconnects between pads 38 and 40. The electrical connection utilizing the solder balls or bumps 39 with pads 38 and 40 can incorporate so-called wafer bump technology.

Suitable encapsulant 44 can be provided over the chip 12 and substrate 14 as shown. Additionally, and/or alternatively, thermal transfer devices (not shown) such as heat sinks and heat spreaders can be provided over the chip 12.

Contact pads 30 (only some of which are labeled) are on an underside of the board 14 (i.e., on a side of board 14 in opposing relation relative to the side proximate chip 12). Contact pads 30 typically comprise stacks of copper, nickel and gold. Solder balls 32 (only some of which are labeled) are provided on the contact pads and utilized to form electrical interconnections between the contact pads 30 and other circuitry (not shown) external of the chip package. The contact pads 40 can be connected with pads 30 through circuit traces (not shown) extending through board 14.

The shown package 50 has solder proximate chip 12 from at least balls 39, and possibly through wafer bumps associated with pads 38 and/or pads 40. There can be other applications of solder within package 50 which are not specifically shown. For instance, a solder paste can be provided between chip 12 and various thermal transfer devices.

The solders utilized in package 50 can be problematic, as discussed above, in that the solders can contain alpha particle emitters. Alpha particles are problematic for semiconductor devices because the alpha particles can induce so-called soft errors. The errors are referred to being "soft" in that the errors are not permanent. However, the errors will typically cause at least one round of incorrect calculations.

There are numerous sources for alpha particles, including reactions caused by cosmic rays. However, the source which is frequently most problematic for semiconductor device packages is solder utilized for forming various interconnections relative to semiconductor dies. For instance, the wafer-bump technique is becoming relatively common for forming high density interconnects to semiconductor dies. The bumps are portions of solder formed over electrical nodes associated with a semiconductor die package. If the solder utilized in the bumps has alpha particle emitting components, the alpha particles are frequently emitted close to integrated circuitry associated with the semiconductor die.

Occasionally, the solder formed over the electrical nodes is in the form of large pillars. Such pillars are frequently referred to as columns. For purposes of interpreting this disclosure, the term "bump" is to be understood to encompass various forms of solder formed over electrical nodes, including the forms commonly referred to as columns.

A typical component of many solders is lead. However, one of the lead isotopes (specifically $^{210}$PB) has a decay chain that leads to alpha particles. Further, various common contaminants of lead can emit alpha particles, including, for example, isotopes of uranium, thorium, radium and polonium.

The alpha particle emitters present in lead can be present in the ore from which the lead is initially refined. Alpha particle emitters can be alternatively, or additionally, introduced during processing and/or use of the lead. For instance, phosphoric acid and some antistatic systems contain alpha particle emitters; some abrasives and cleaning agents can introduce alpha particle emitters into lead; and smelting of commercial lead can introduce uranium, thorium and other alpha particle emitters into the lead from gangue rock.

The amount of alpha particle emitters present in lead is typically determined by an alpha flux measurement, with results stated in terms of alpha particle counts per unit area per hour ($cts/cm^2/hr$). It is possible to commercially obtain lead having an alpha flux of from 0.002 to 0.02 $cts/cm^2/hr$, but it is very difficult to obtain a material with a lower alpha flux. However, the semiconductor industry is requesting materials with significantly lower alpha flux, including for example, materials having an alpha flux of less than 0.0001 $cts/cm^2/hr$.

Among the difficulties associated with reducing the concentration of alpha flux emitters in a material to extremely low levels is a difficulty in measuring the concentration of the emitters at flux levels below 0.002 $cts/cm^2/hr$. Unless the concentration can be measured, it is difficult to monitor a purification process to determine if alpha particle emitters are being removed. For instance, it can be difficult to determine at any given stage of the purification process if alpha particle emitters are fractionating with a material or away from the material.

Although the discussion above focuses on removing alpha particle emitters from lead-containing solders, it should be understood that alpha particle emitters are also problematic in other materials. For instance, one of the methods utilized to reduce the concentration of alpha particle emitters in solder has been to create so-called lead-free solders. Such solders contain little, if any, lead, which is desirable from an environmental perspective. However, the solders can still have an undesirable amount of alpha particle emitters present therein. Exemplary lead free solders are Sn:3.5% Ag; Sn:4% Ag:0.5% Cu; and Bi:2-13% Ag, where the percentages are by weight.

One of the methods which has been utilized for reducing the number of alpha particle emitters in lead-containing solders is to start with lead materials which have very few emitters therein. Presently there are three sources of such materials. The sources are (1) very old lead where the $^{210}$Pb has substantially all decayed; (2) some specific PbS ore bodies which have very little $^{210}$Pb therein, and which have been carefully refined; and (3) lead which has been subjected to laser isotope separation to remove the $^{210}$Pb from the lead. Various problems exist with all of the sources. For instance, the first source utilizes very old Pb, and such is often poorly refined and therefore contains various radionuclides as contaminants. The second source typically does not have a low enough alpha particle emitter concentration to meet the ultimately desired requirements of the semiconductor industry. The third source is very energy intensive to form, and therefore is not commercially feasible.

SUMMARY OF THE INVENTION

In one aspect, the invention includes a method of refining a lead-free material. An initial composition of the material is provided. The initial composition has an alpha flux of greater than or equal to 0.002 cts/cm$^2$/hr. The material is purified to form a second composition of the material. The second composition has an alpha flux of less than 0.001 cts/cm$^2$/hr. The purification can comprise, for example, electro-refining and/or chemical refining. A solder may be formed from the lead-free material. The lead free material may comprise elemental tin in one embodiment.

BRIEF DESCRIPTION OF THE DRAWINGS

Preferred embodiments of the invention are described below with reference to the following accompanying drawings.

DETAILED DESCRIPTION

Figure 1:
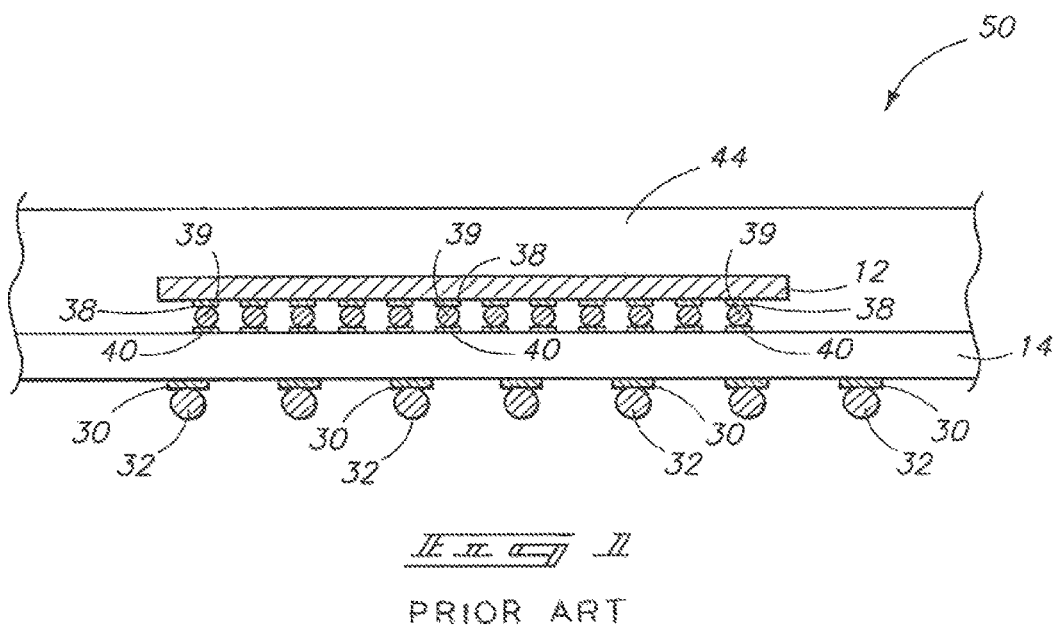
FIG. 1 is a diagrammatic cross-sectional side view of a prior art semiconductor package construction.

This disclosure of the invention is submitted in furtherance of the constitutional purposes of the U.S. Patent Laws "to promote the progress of science and useful arts" (Article 1, Section 8).

One aspect of the invention is a recognition that even though a lead isotope ($^{210}$Pb) is the prominent alpha emitter of lead containing high concentrations of alpha emitters, such is not the case with lead containing low or very low concentrations of alpha emitters. For purposes of interpreting this disclosure and the claims that follow, lead containing low concentrations of alpha emitters is lead having an alpha flux of about 0.02 cts/cm$^2$/hr, and lead containing very low concentrations of alpha emitters is lead having an alpha flux of about 0.002 cts/cm$^2$/hr.

It appears that uranium isotopes, thorium isotopes, and perhaps other non-lead isotopes are the primary alpha emitters of lead containing low or very low concentrations of alpha emitters. This conclusion is based on the observation that alpha flux versus time for lead containing low and very low concentrations of alpha particle emitters does not follow the secular equilibrium curve predicted from $^{210}$Pb decay. The recognition that the primary alpha emitters of lead are non-lead isotopes leads to improved methods for reducing the alpha emitter level of lead initially containing low and very low concentrations of alpha particle emitters. Specifically, the alpha emitter level can be reduced with purification methods that remove the minor amounts of non-lead contaminants from the lead. An exemplary method developed in accordance with aspects of the present invention is electro-refining utilizing a bath containing nitric acid:water (with the nitric acid concentration being from about 2% to about 50%, by volume).

The recognition that non-lead impurities are a primary alpha emitters for lead containing low or very low concentrations of alpha emitters is also supported by an observation that alpha flux of such lead can scale with impurity content of the lead.

Although the invention is generally described herein with reference to removing alpha particle emitting materials from lead, it is to be understood that the invention can also be utilized for purifying materials other than lead (for example metals, such as tin, silver, copper, indium, bismuth etc. that are frequently incorporated into lead-free solders). The removal of alpha particles can be particularly beneficial for metals utilized in semiconductor manufacture; such as, for example, metals incorporated into wafer bump solders.

One aspect of the invention is a method of indirectly tracking a low concentration of at least one alpha particle emitter during purification of an elemental material. The alpha particle emitter is a contaminant, rather than an isotope of the material. In particular aspects the material can be lead and the alpha particle emitters are isotopes of thorium and uranium. One or more contaminants are identified which are present in the elemental material at a greater concentration than the alpha particle emitters, and which fractionate similarly to the emitters during purification. The identified contaminants are preferably substances which can be easily tracked during the purification. The fractionation of the contaminants refers to distribution of the contaminants between a portion remaining with the elemental material which is to be purified during the purification process, and a portion separating from the elemental material. Preferably, the fractionation will be such that substantially entirely all of the contaminants separate from the elemental material during the purification process.

The fractionation of the contaminants is tracked during the purification, and from such tracked fractionation is extrapolated the fractionation of one or more alpha particle emitters. Accordingly, the fractionation of the alpha particle emitter is inferred (i.e., indirectly determined), rather than being directly measured. Such can avoid problems associated with attempting to measure an alpha flux for a material having a very low concentration of alpha particle emitters. A low or very low concentration of alpha particle emitters generates an alpha flux which is typically not significantly different from background, and which is accordingly typically very difficult to measure with a high degree of confidence. Since the alpha particle emitters are contaminants rather than isotopes of the elemental material being purified, the alpha particle emitters will fractionate with other contaminants if the purification utilizes methodology which very specifically fractionates the elemental material from contaminating substances. Exemplary methodology having appropriate specificity is electro-refining. Chemical refining can also be used, either in addition to or alternatively to the electro-refining.

The elemental material which is to be purified can, as discussed above, be lead, and can initially comprise at least 99.99 weight % lead prior to the purification. Accordingly, the elemental material which is to be purified can be considered to consist essentially of, or consist of, lead. In other aspects, the elemental material which is to be purified can consist essentially of, or consist of Ag, Sn, Cu, Bi and In. In specific aspects, the material which is to be purified can be ultimately used in a lead-free solder.

The method of purification can be any suitable method, including, for example, chemical refining and/or electro-refining. In an exemplary method of purifying lead, electro-refining is utilized with a bath comprising water and one or more of nitric acid, methane sulfonic acid, fluosilicate and fluoborate. In particular aspects of the invention it is found that electro-refining of lead in a bath comprising or consisting essentially of nitric acid and water (with the nitric acid being present to a concentration of from about 2% to about 50%, by volume) can be particularly effective for reducing the alpha flux of lead that initially contains low or very low concentrations of alpha emitters. Exemplary conditions for the electro-refining of the lead in a nitric acid bath include a bath temperature of from about 70° F. (21° C.) to about 100° F. (38° C.), a treatment time of from about several hours to about several days, and a treatment current density of from about 1 A/ft$^2$ to about 70 A/ft$^2$.

Figure 2:
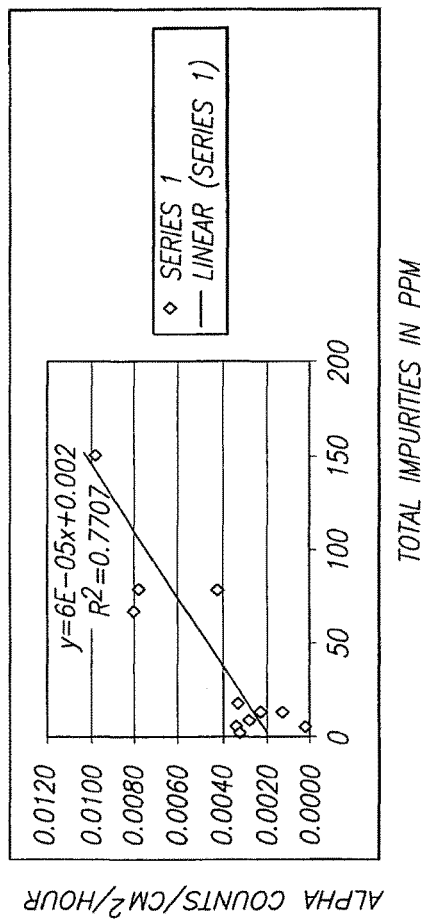
FIG. 2 is a graph of alpha counts/cm$^2$/hour versus total impurities for a material purified in accordance with an aspect of the present invention.
Figure 3:
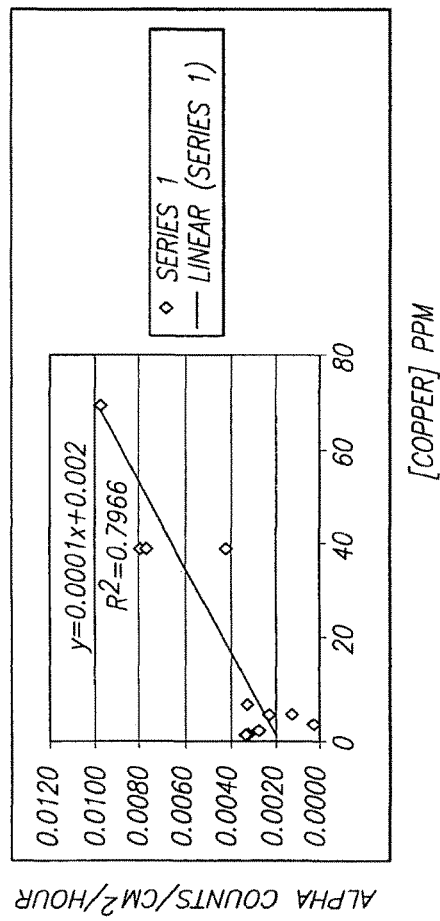
FIG. 3 is a graph of alpha counts/cm$^2$/hour versus copper concentration for a material purified in accordance with an aspect of the present invention.
Figure 4:
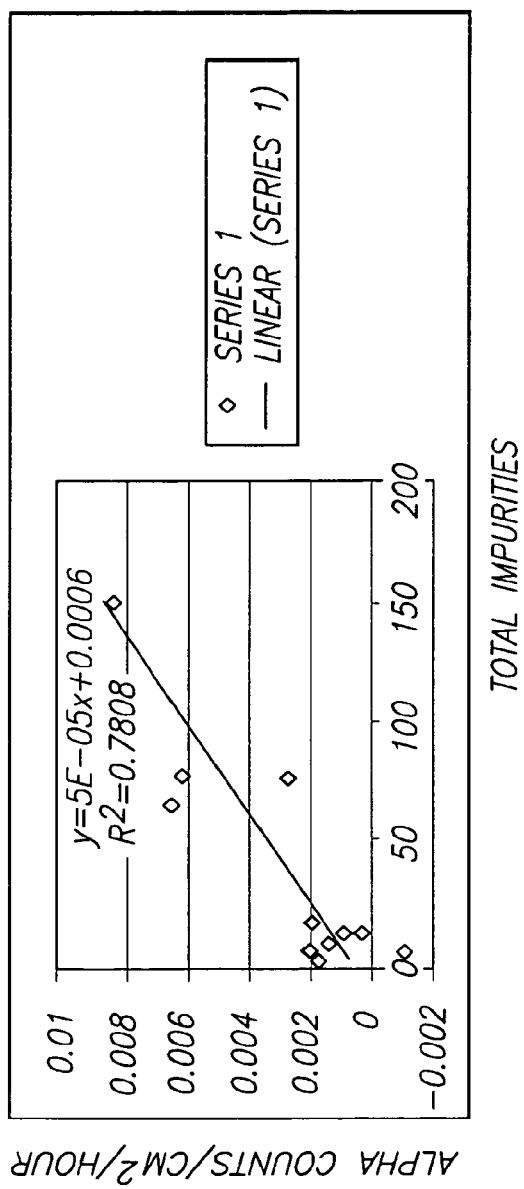
FIG. 4 is a graph of alpha counts/cm$^2$/hour versus total impurities for a material purified in accordance with an aspect of the present invention.
Figure 5:
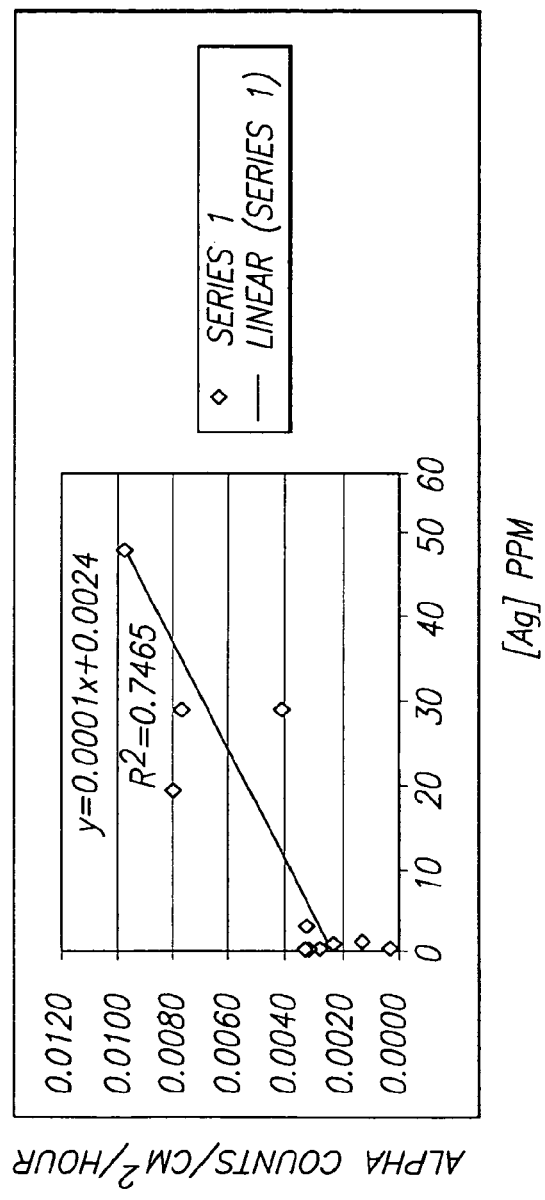
FIG. 5 is a graph of alpha counts/cm$^2$/hour versus silver concentration for a material purified in accordance with an aspect of the present invention.

Several graphs are provided with this disclosure (labeled as FIGS. 2-5), and such graphs evidence that the alpha flux of a material can scale with the total amount of impurities in the material. Accordingly, the fractionation of alpha emitting particles during a purification process can be extrapolated from the fractionation of other impurities during the purification process. Purification of 99.99% pure silver to 99.999% pure silver resulted in a decrease of alpha activity from 0.0162±0.0017 cts/cm$^2$/hr to 0.0062±0.0007 cts/cm$^2$/hr. Purification of 99.99% pure tin to 99.999% pure tin resulted in a decrease of alpha activity from 0.0066±0.0005 to 0.0007±0.0008.

TABLE 1

Trace Element Components of Silver

| Element | Concentration (ppm) in 99.99% Ag | Concentration (ppm) in 99.999% Ag |
|---|---|---|
| Au | 7 | <0.5 |
| Cu | 5 | <0.1 |
| Bi | 10 | <0.1 |
| Fe | 0.7 | <0.1 |

TABLE 2

Trace Element Components of Tin

| Element | Concentration (ppm) in 99.99% Sn | Concentration (ppm) in 99.999% Ag |
|---|---|---|
| Ag | 1 | 0.1 |
| Cu | 1 | 0.1 |
| Mg | .3 | 0.1 |
| Si | .3 | 0.1 |
| Pb | 10 | <0.2 |

As stated above, the methodologies of the present invention can be utilized for purifying materials associated with lead-free solders, as well as for purifying materials associated with lead-containing solders. The utilization of the methodologies for reducing alpha emitter concentrations in lead-free solders can have numerous advantages. For instance, it is frequently assumed that lead-free solders will have little or no alpha emitters therein. Such assumption is a poor assumption, and is based on the mistaken belief that $^{210}$Pb is the primary alpha emitter in solders. Ideally there would be no alpha emitters present in a lead-free material, or at least the level of alpha emission would be below the very low threshold discussed above (i.e., having an alpha flux below about 0.002 cts/cm$^2$/hr). Such is not available in lead-free solders conventionally utilized in semiconductor packaging, but can be achieved in lead-free solders prepared utilizing methodologies of the present invention. Specifically, methodologies of the present invention can substantially remove alpha emitters (such as isotopes of thorium and uranium) from lead-free solder materials. The removal of the alpha emitting contaminants can most easily be verified by measuring the alpha flux of the sample since they are normally present below the detection limits of most analytical methods such as glow discharge mass spectrometry (GDMS). However analytical methods like GDMS can be used to track the concentration of non alpha emitting impurities that are present in higher concentration than the alpha emitters and are removed at a similar rate as the alpha emitters during purification.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of refining an elemental material selected from the group consisting of tin, silver, copper, indium and bismuth, the method comprising electrorefining the elemental material to decrease an alpha flux of the elemental material to less than 0.002 cts/cm$^2$/hr, and wherein the elemental material is electrorefined in a bath comprising acid and water.

2. The method of claim 1 wherein the acid is present in the bath at a concentration between about 2% and about 50% by volume.

3. The method of claim 1 wherein the acid comprises methane sulfonic acid.

4. The method of claim 1 wherein electrorefining the elemental material comprises applying a current to the elemental material at a current density between about 1 A/ft$^2$ and about 70 A/ft$^2$.

5. The method of claim 1 further comprising at least one of the following additional steps:
zone refining the elemental material; and
chemical etching the elemental material.

6. The method of claim 1 wherein prior to the electrorefining step the elemental material comprises tin that is no more than 99.99 wt % pure.

7. The method of claim 6 wherein after the electrorefining step the elemental material comprises tin that is at least 99.999 wt % pure.

8. The method of claim 1, further comprising the additional step of:
forming a solder from the elemental material.

9. The method of claim 8 wherein the forming step comprises forming a solder paste.

10. The method of claim 8 wherein the forming step comprises forming a solder pre-form.

11. The method of claim 1 wherein prior to electrorefining, the elemental material has an alpha flux of greater than 0.002 cts/cm$^2$/hr.

12. The method of claim 1 wherein after the electrorefining step the elemental material has an alpha flux of less than 0.001 cts/cm$^2$/hr.

13. A method of refining elemental tin, the method comprising electrorefining the elemental tin to decrease an alpha flux of the elemental tin to less than 0.002 cts/cm$^2$/hr, and wherein:
the elemental tin is electrorefined in a bath comprising acid and water.

14. The method of claim 13, wherein the acid is present in the bath at a concentration between about 2% and about 50% by volume.

15. The method of claim 13, wherein electrorefining the elemental tin comprises applying a current to the elemental tin at a current density between about 1 A/ft$^2$ and about 70 A/ft$^2$.

16. The method of claim 13, wherein after the electrorefining step the elemental tin has an alpha flux of less than 0.001 cts/cm$^2$/hr.

17. The method of claim 13, further comprising the additional step of forming a solder from the elemental tin.

18. The method of claim 17, wherein the forming step further comprises forming one of a solder paste and a solder pre-form.

19. The method of claim 17, wherein after the electrorefining step the elemental tin is at least 99.999 wt. % pure.

20. The method of claim 13, wherein prior to the electrorefining step the elemental tin is no more than 99.999 wt. % pure.

* * * * *